United States Patent
Branch et al.

(10) Patent No.: US 7,908,535 B2
(45) Date of Patent: Mar. 15, 2011

(54) SCAN TESTABLE REGISTER FILE

(75) Inventors: Charles M. Branch, Dallas, TX (US);
Steven C. Bartling, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 72 days.

(21) Appl. No.: 12/495,046

(22) Filed: Jun. 30, 2009

(65) Prior Publication Data

US 2010/0332929 A1  Dec. 30, 2010

(51) Int. Cl.
  *G01R 31/28* (2006.01)
  *G11C 29/00* (2006.01)

(52) U.S. Cl. ........ 714/729; 714/718; 714/726; 714/731; 365/200

(58) Field of Classification Search .................. 714/729, 714/718, 726, 731; 365/200
See application file for complete search history.

(56) References Cited

U.S. PATENT DOCUMENTS

| | | | |
|---|---|---|---|
| 4,493,077 A | 1/1985 | Agrawal et al. | |
| 5,631,911 A | 5/1997 | Whetsel, Jr. | |
| 5,917,832 A | 6/1999 | Baeg et al. | |
| 5,926,487 A * | 7/1999 | Chappell et al. | 714/731 |
| 5,961,653 A | 10/1999 | Kalter et al. | |
| 6,055,649 A * | 4/2000 | Deao et al. | 714/30 |
| 6,611,934 B2 | 8/2003 | Whetsel, Jr. | |
| 6,763,485 B2 * | 7/2004 | Whetsel | 714/726 |
| 6,925,590 B2 | 8/2005 | Campbell | |
| 7,383,480 B2 | 6/2008 | Martin et al. | |
| 7,516,379 B2 * | 4/2009 | Rohrbaugh et al. | 714/731 |
| 2003/0131295 A1 | 7/2003 | Berry, Jr. et al. | |
| 2003/0200493 A1 | 10/2003 | Campbell | |
| 2004/0250165 A1 * | 12/2004 | Tanizaki | 714/30 |
| 2005/0010832 A1 | 1/2005 | Caswell et al. | |
| 2005/0210179 A1 | 9/2005 | Wamsley et al. | |
| 2005/0235185 A1 | 10/2005 | Campbell | |
| 2010/0153796 A1 * | 6/2010 | Rachapalli | 714/731 |

OTHER PUBLICATIONS

Yano et al., Memory Array Testing through a Scannable Configuration, 1997, IEEE, pp. 87-94.*
Yano, Unified Scan Design with Scannable Memory Arrays, Nov. 1995, IEEE, pp. 153-159.*
Seuring, Combining Scan Test and Built-in Self Test, Jun. 26, 2006, Journal of Electronic Testing: Theory and Applications, pp. 297-299.*
Vorisek et al., At-speed Testing of SOC ICs, 2004, IEEE. pp. 1-6.*

* cited by examiner

*Primary Examiner* — John J Tabone, Jr.
(74) *Attorney, Agent, or Firm* — John J. Patti; Wade J. Brady, III; Frederick J. Telecky, Jr.

(57) ABSTRACT

Memory compiler engineers often focus on the efficient implementation of the largest possible memory configurations for each memory type. The overhead of test and control circuitry within memory implementations is usually amortized across a large number of storage bits. Unfortunately, test structures generally do not scale down with decreasing memory sizes, creating a large area penalty for a design with numerous small memories. One solution is a scannable register file (SRF) architecture using scannable latch bit-cells laid out using a standard cell layout/power template. All sub-cells can be placed in standard cell rows and utilize standard cell power straps. Non-SRF standard cells can be abutted on all sides, placement keep-out regions are not needed. Metal utilization is usually limited to first three metallization layers. The bit-cell is much larger than standard compiled memory bit cells, but has no overhead beyond address decode, word-line drivers, and read-write data latches.

18 Claims, 10 Drawing Sheets

SCAN TESTABLE REGISTER FILE

TECHNICAL FIELD

The invention relates generally to memory and, more particularly, to a register file.

BACKGROUND

Figure 1:
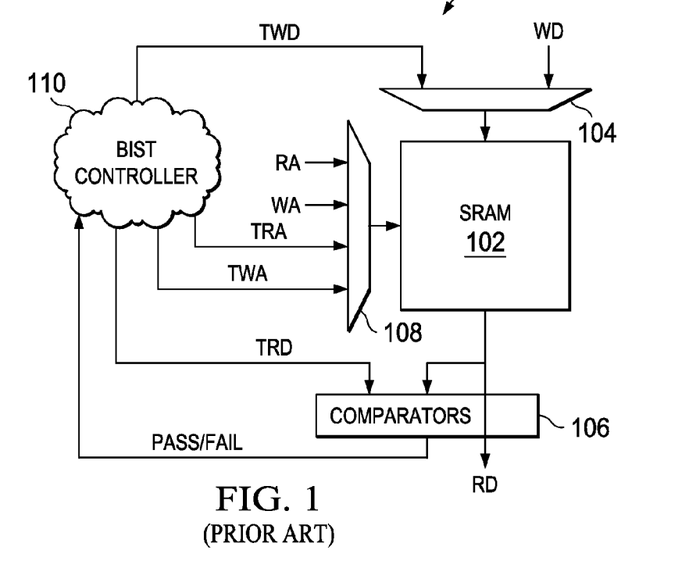
FIG. 1 is an example of a conventional circuit that employs SRAM with BIST circuitry.

Applications Specific Integrated Circuit or ASICs, as well as other circuits, often use conventional Static Random Access Memory (SRAM). Conventional SRAM typically employs built-in self-test or BIST circuitry. An example of conventional circuit 100 that employs SRAM 102 with BIST circuitry can be seen in FIG. 1. Generally, a BIST controller 110 uses numerous data lines (e.g., RA, WA, TRD, pass/fail). To use all of these data lines, multiplexers or muxes 104 and 108 are employed, which can cause severe performance penalties. In addition to the performance penalties of the muxes 104 and 108, performance penalties can also be present from the comparators 106. Moreover, BIST circuitry consumes a considerable amount of power and generally has a substantial footprint, which is also undesirable.

Some examples of conventional circuits are: U.S. Pat. No. 4,493,077; U.S. Pat. No. 5,631,911; U.S. Pat. No. 5,917,832; U.S. Pat. No. 5,961,653; U.S. Pat. No. 6,611,934; U.S. Pat. No. 6,763,485; U.S. Pat. No. 6,925,590; U.S. Pat. No. 7,383,480; U.S. Pat. No. 7,516,379; U.S. Patent Pre-Grant Publ. No. 2003/0131295; U.S. Patent Pre-Grant Publ. No. 2003/0200493; U.S. Patent Pre-Grant Publ. No. 2005/0010832; U.S. Patent Pre-Grant Publ. No. 2005/0210179; U.S. Patent Pre-Grant Publ. No. 2005/0235185; and U.S. Patent Pre-Grant Publ. No. 2008/0091995.

SUMMARY

A preferred embodiment of the present invention, accordingly, provides an apparatus. The apparatus comprises a scan chain having a plurality of scan latches that are coupled to one another, wherein each of the scan latches is controlled by one of a first latch control signal and a second latch control signal; input logic including: an input latch that is control by a first scan clock signal and that receives a scan input signal; and a first multiplexer having a first input terminal, a second input terminal, a selection terminal, and an output terminal, wherein the first input terminal of the first multiplexer receives the scan input signal, and wherein the second terminal of the first multiplexer is coupled to the input latch, and wherein the selection terminal of the first multiplexer receives a master control signal, and wherein the output terminal of the first multiplexer is coupled to the scan chain; output logic including: an output latch that is control by a second scan clock signal and that is coupled to the scan chain; and a second multiplexer having a first input terminal, a second input terminal, a selection terminal, and an output terminal, wherein the first input terminal of the second multiplexer is coupled to the scan chain, and wherein the second terminal of the second multiplexer is coupled to the output latch, and wherein the selection terminal of the second multiplexer receives the master control signal; a scan clock generator that generates the first and second scan clock signals and that is coupled to the input and output latches; and an odd/even generator that generates the first latch control signal and the second latch control signal, the including: a third multiplexer having a first input terminal, a second input terminal, a selection terminal, and an output terminal, wherein each of the first and second input terminals of the third multiplexer is coupled to the scan clock generator, and wherein the selection terminal of the third multiplexer receives the master control signal, and wherein the output terminal of the third multiplexer is coupled a first set of scan latches from the scan chain; and a fourth multiplexer having a first input terminal, a second input terminal, a selection terminal, and an output terminal, wherein each of the first and second input terminals of the fourth multiplexer is coupled to the scan clock generator, and wherein the selection terminal of the fourth multiplexer receives the master control signal, and wherein the output terminal is coupled of the fourth multiplexer a second set of scan latches from the scan chain.

In accordance with a preferred embodiment of the present invention, the scan chain further comprises a plurality of scan chains.

In accordance with a preferred embodiment of the present invention, the input logic further comprises a plurality of input latches, wherein each input latch is control by the first scan clock signal, and wherein each input latch that receives the scan input signal; and a plurality of first multiplexers, wherein each first multiplexer has a first input terminal, a second input terminal, a selection terminal, and an output terminal, wherein the first input terminal of each first multiplexer receives the scan input signal, and wherein the second terminal of each first multiplexer is coupled to at least one of the plurality of the input latch, and wherein the selection terminal of each first multiplexer receives the master control signal, and wherein the output terminal of each first multiplexer is coupled to at least one of the plurality of scan chains.

In accordance with a preferred embodiment of the present invention, the output logic further comprises: a plurality of output latches, wherein each output latch is control by a second scan clock signal, and wherein each output latch is coupled to one of the plurality of the scan chains; and a plurality of second multiplexers, wherein each second multiplexer has a first input terminal, a second input terminal, a selection terminal, and an output terminal, wherein the first input terminal of each second multiplexer is coupled to at least one of the plurality of scan chains, and wherein the second terminal of each second multiplexer is coupled to at least one of the plurality of the output latches, and wherein the selection terminal of each second multiplexer receives the master control signal.

In accordance with a preferred embodiment of the present invention, the scan clock generator further comprises: a first delay element that receives a clock signal; a first inverter that is coupled receives the clock signal; a second delay element that is coupled to the first delay element; a second inverter that is coupled to the second delay element; and a logic gate that is coupled to the first delay element and the second inverter.

In accordance with a preferred embodiment of the present invention, the logic gate is an AND gate.

In accordance with a preferred embodiment of the present invention, the scan clock generator further comprises: a first inverter that receives a clock signal; a first delay element that receives the clock signal; a second delay element that is coupled to the first inverter; a first logic gate that is coupled to first inverter and the second delay element; and a second logic gate that is coupled to the first delay element and that receives the clocks signal.

In accordance with a preferred embodiment of the present invention, each of the first and second logic gates further comprises an AND gate.

In accordance with a preferred embodiment of the present invention, each scan latch further comprises: a first transmission gate that is controlled by a write enable signal; a first tristate inverter that is coupled to the first transmission gate and that is controlled by the write enable signal; a second tristate inverter that is coupled to first transmission gate and that is controlled by at least one of the first and second latch control signals; a third tristate inverter that is coupled to the first and second tristate inverters, wherein the third tristate inverter is controlled by a read enable signal; and a third transmission gate that is coupled to the first and second tristate inverters, wherein the third transmission gate is controlled by at least one of the first and second latch control signals.

In accordance with a preferred embodiment of the present invention, an apparatus is provided. The apparatus comprises a memory array having a plurality of memory cells; a scan chain having a plurality of scan latches that are coupled to one another, wherein each of the scan latches is controlled by one of a first latch control signal and a second latch control signal, and wherein the scan chain is coupled to the memory array; input logic including: an input latch that is control by a first scan clock signal and that receives a scan input signal; and a first multiplexer having a first input terminal, a second input terminal, a selection terminal, and an output terminal, wherein the first input terminal of the first multiplexer receives the scan input signal, and wherein the second terminal of the first multiplexer is coupled to the input latch, and wherein the selection terminal of the first multiplexer receives a master control signal, and wherein the output terminal of the first multiplexer is coupled to the scan chain; output logic including: an output latch that is control by a second scan clock signal and that is coupled to the scan chain; and a second multiplexer having a first input terminal, a second input terminal, a selection terminal, and an output terminal, wherein the first input terminal of the second multiplexer is coupled to the scan chain, and wherein the second terminal of the second multiplexer is coupled to the output latch, and wherein the selection terminal of the second multiplexer receives the master control signal; a scan clock generator that generates the first and second scan clock signals and that is coupled to the input and output latches; and an odd/even generator that generates the first latch control signal and the second latch control signal, wherein the including: a third multiplexer having a first input terminal, a second input terminal, a selection terminal, and an output terminal, wherein each of the first and second input terminals of the third multiplexer is coupled to the scan clock generator, and wherein the selection terminal of the third multiplexer receives the master control signal, and wherein the output terminal of the third multiplexer is coupled a first set of scan latches from the scan chain; and a fourth multiplexer having a first input terminal, a second input terminal, a selection terminal, and an output terminal, wherein each of the first and second input terminals of the fourth multiplexer is coupled to the scan clock generator, and wherein the selection terminal of the fourth multiplexer receives the master control signal, and wherein the output terminal is coupled of the fourth multiplexer a second set of scan latches from the scan chain; a controller that is coupled to the scan chain, the input logic, the output logic, and the odd/even generator; a read decoder that is coupled to the memory array; and a write decoder that is coupled to the memory array.

In accordance with a preferred embodiment of the present invention, the scan chain further comprises a plurality of scan chains that are each coupled to the memory array.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Refer now to the drawings wherein depicted elements are, for the sake of clarity, not necessarily shown to scale and wherein like or similar elements are designated by the same reference numeral through the several views.

Figure 2A:
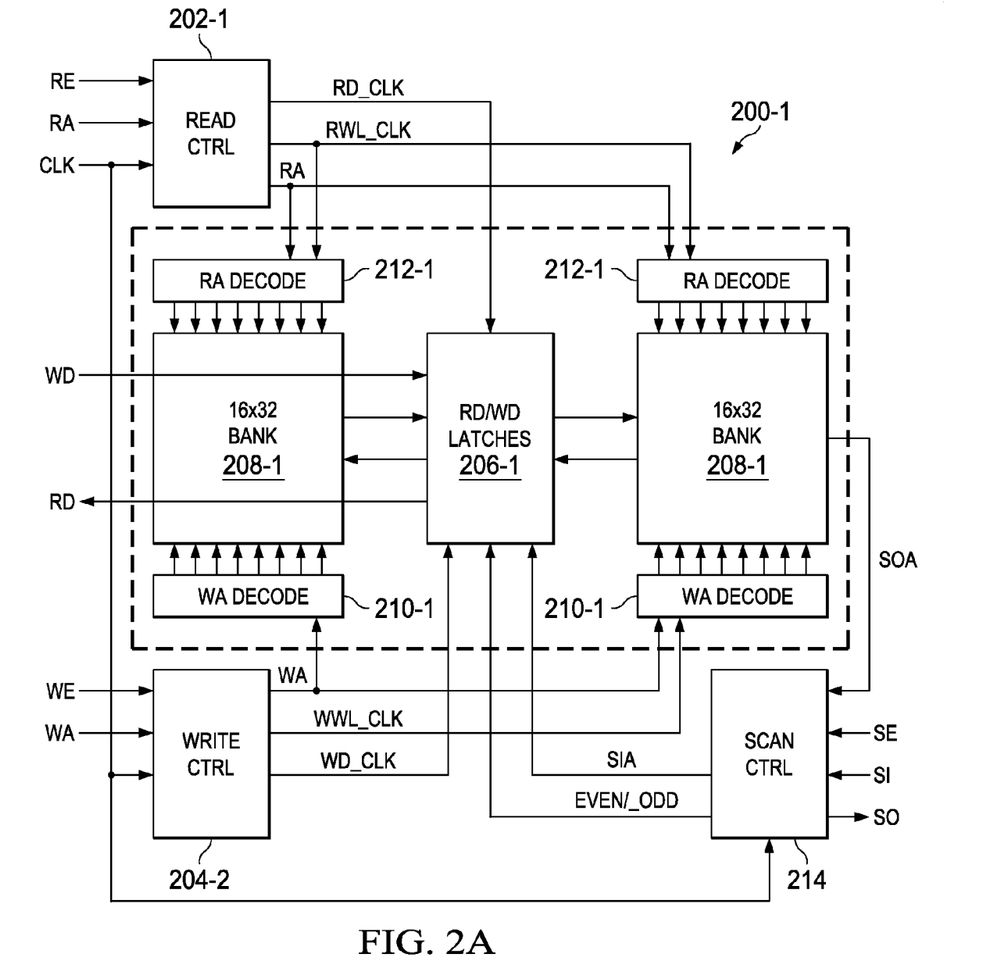
FIGS. 2A and 2B are examples of scannable register files (SRFs) in accordance with a preferred embodiment of the present invention.

Referring to FIG. 2A of the drawings, the reference numeral 200-1 generally depicts a scannable register file (SRF) in accordance with a preferred embodiment of the present invention. In this configuration, two banks or arrays 208-1 of 16×32 memory cells are provided. Each of the banks 208-1 has a read address (RA) decoder 212-1 and a write address (WA) decoder 210-1 associated with it, which are controlled by the read controller 202-1 and write controller 204-1, respectively. Between the two banks 208-1 are latches 206-1 that are able to read data (RD) or write data (WD) in a functional mode or operate as scan latches in a scan mode. These latches 206-1 are generally controlled by the scan controller 214, the read controller 202-1, and the write controller 204-2.

Figure 2B:
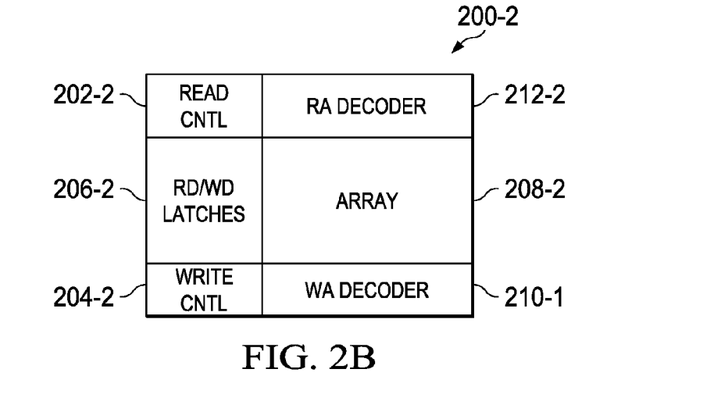

Turning to FIG. 2B, another SRF 200-2 can be seen, which has a different configuration than SRF 200-1. With SRF 200-2, a single array 208-2 of memory cells is present. Similar to SRF 200-1, array 208-1 has an RA decoder 212-2 and a WA decoder 210-2 associated with it, which are controlled by read controller 202-2 and write controller 204-2, respectively. Additionally (and similar to SRF 200-1), latches 206-2 are also provided, which operate in both a functional mode and a scan mode.

Figure 3A:
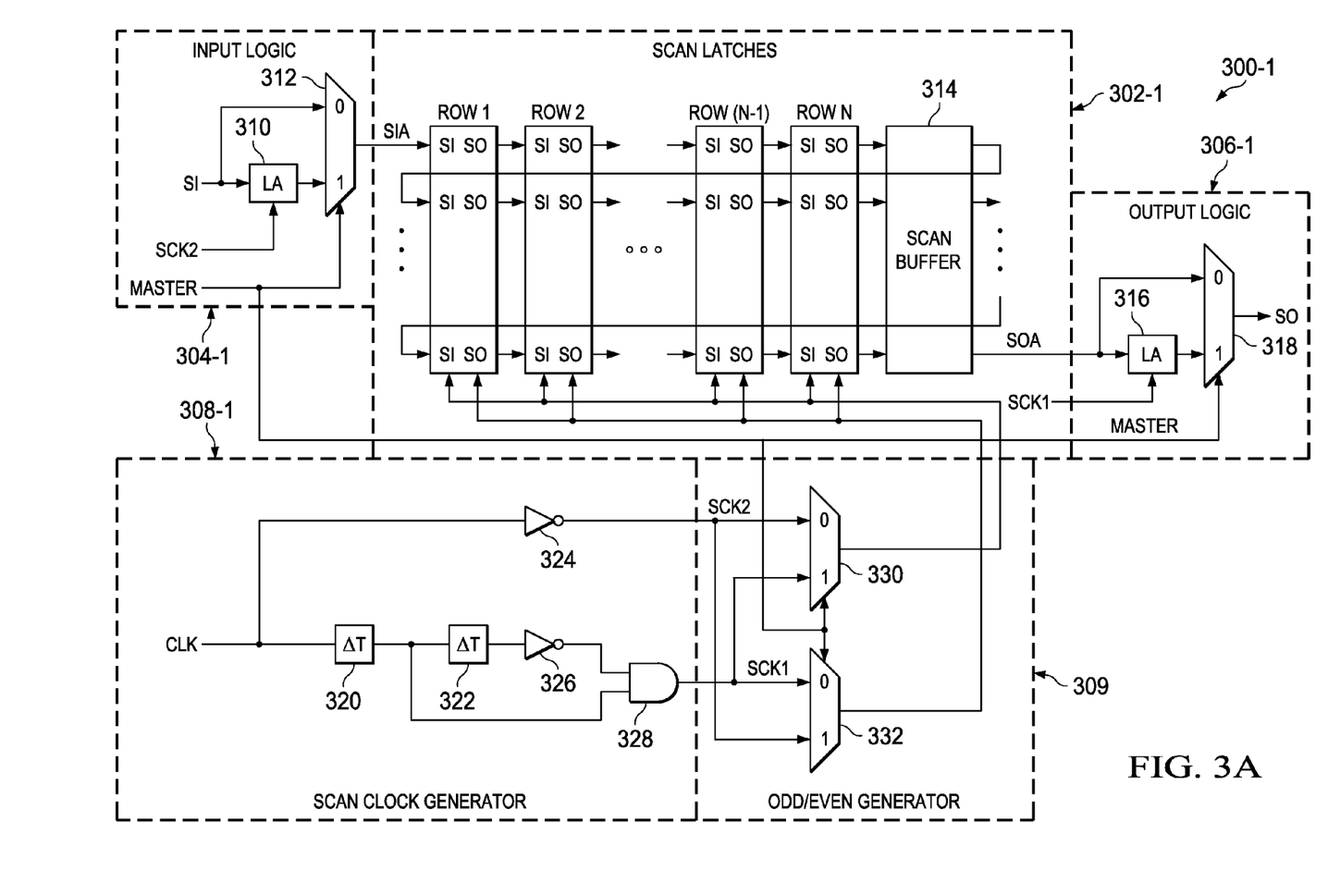
FIGS. 3A and 3B are block diagrams depicting examples of scan architectures for the SFR of FIG. 2A and/or FIG. 2B.

Referring now to FIGS. 3A ad 3B, examples of scan architectures 300-1 and 300-2 for SRFs 200-1 and/or 200-2 can be seen. Preferably, these architectures 300-1 and 300-2 are generally comprised of elements from difference sub-components of the SRFs 200-1 and/or 200-2. Scan latches 302-1 and/or 302-2 (as well as input logic 304-1 and/or 304-2 and output logic 306-1 and/or 306-2) generally comprise at least a portion of the latches 206-1 and/or 206-2. The scan clock generators 308-1 and/or 308-2 and odd/even generator 309 generally comprise at least a portion of scan controller 214 and/or latches 206-2.

Turning first to architecture 200-1, a single scan chain and corresponding supporting circuitry are shown. Preferably, the scan latches for each row ROW1 to ROWn (or, alternatively, for columns) and scan buffer 314 are daisy-chained together to formed a single scan chain (which can be arranged to scan in either direction). Within each row ROW1 to ROWn, there are two latches where the first latch is referred to as an even latch and the second latch is referred to as an odd latch. For this configuration, the input logic 304-1 is generally comprised of an input latch 310 (which is controlled by a scan clock signal SCK2 and which can receive scan data or scan input signal SI) and a multiplexer or mux 312 (which is controlled by the master control signal MASTER). The output terminal of multiplexer 312 is then coupled to the first latch of the scan chain. The mux 312 is coupled to the latch 310 at one input terminal and receives the scan input signal SI at the other terminal. Additionally, the output logic 306-1 is comprised of a latch 316 (which is controlled by a scan clock signal SCK1 and that can receive scan data or scan output signal SOA) and a mux 318 (which is controlled by the master control signal MASTER). The mux 318 and latch 316 are coupled to the scan buffer 314 at the end of the scan chain for this configuration.

Control signals and clocking signals for the architecture 200-1 are generated by the scan clock generator 308-1 and the odd/even generator 309. The scan clock generator 308-1 is generally comprised of delays 320 and 322, inverters 324 and 326, and AND gate 328. Preferably, the clock signal generator 308-1 receives a clock signal CLK and outputs the scan clock signals SCK1 and SCK2 (which are used to control latches 310 and 316). These scan clock signals SCK1 and SCK2 are then provided to the odd/even generator 309 (which is generally comprised of muxes 330 and 332) which provides control signals to the latches 302-1.

In operation, the architecture 200-1 operates in two scan modes that are indicated by the master control signal MASTER (which has a value of "0" or "1"). During the scan modes, the latches 302-1, 310, and 316 are arranged in master-slave pairs during shifting to form scan shift flip-flops. A reason for using two different modes is that, since array contents (i.e., banks 208-1 or array 208-2) are preserved in the slave latches, testing to cover all array faults can be accomplished to two passes (use each scan mode for a pass). Additionally, because of its configuration, this architecture allows for standard automatic test pattern generation (ATPG) techniques to be employed.

Figure 5A:
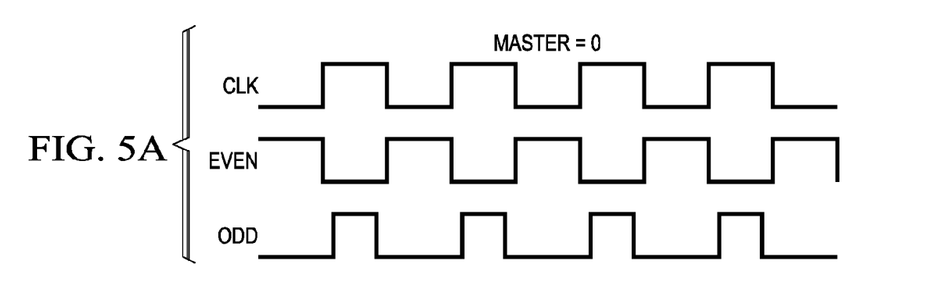
FIGS. 5A and 5B are timing diagrams for latch control signals.

During a first scan mode, when the master control signal MASTER is "0", the latches 302-1 can be arranged to form a set of master-slave pairs without external latches. Preferably, for this scan mode, the even latch for each row ROW1 to ROWn forms a master latch, and the odd latch for each row ROW1 to ROWn forms a slave latch. Because the master control signal MASTER is "0", muxes 312 and 318 bypass latches 310 and 316. Additionally, mux 332 is set by the master control signal MASTER to output scan clock signal SCK1 (which is provided as a control signal to the odd latches for each row ROW1 to ROWn), and mux 330 is set by the master control signal MASTER to output scan clock signal SCK2 (which is provided as a control signal to the odd latches for each row ROW1 to ROWn). The timing signals for the even latches (EVEN) and the odd latches (ODD) in this scan mode can be seen in FIG. 5A.

Figure 5B:
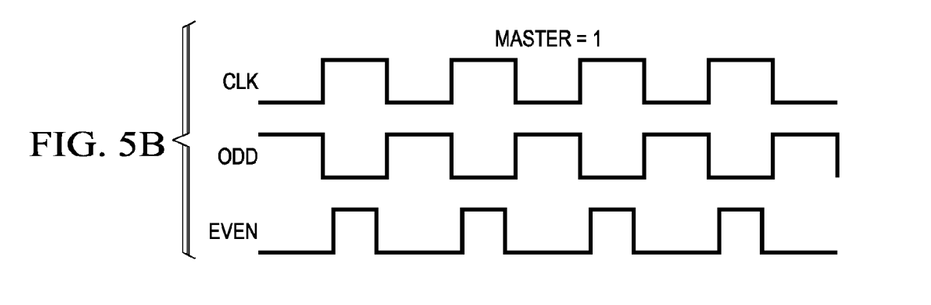
Figure 6A:
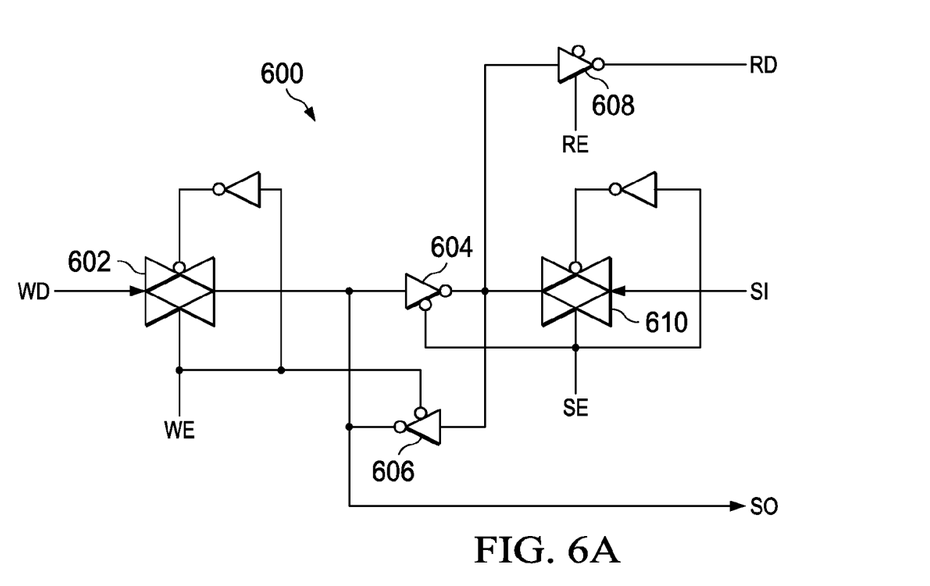
FIGS. 6A through 6D are circuit diagrams depicting an example of a scan latch and its general operation in accordance with a preferred embodiment of the present invention.
Figure 6B:
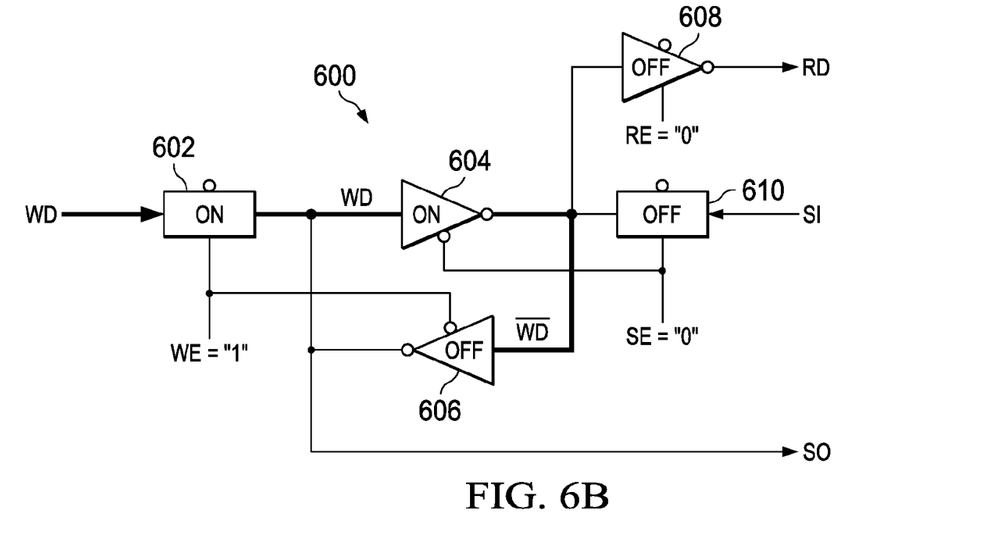
Figure 6C:
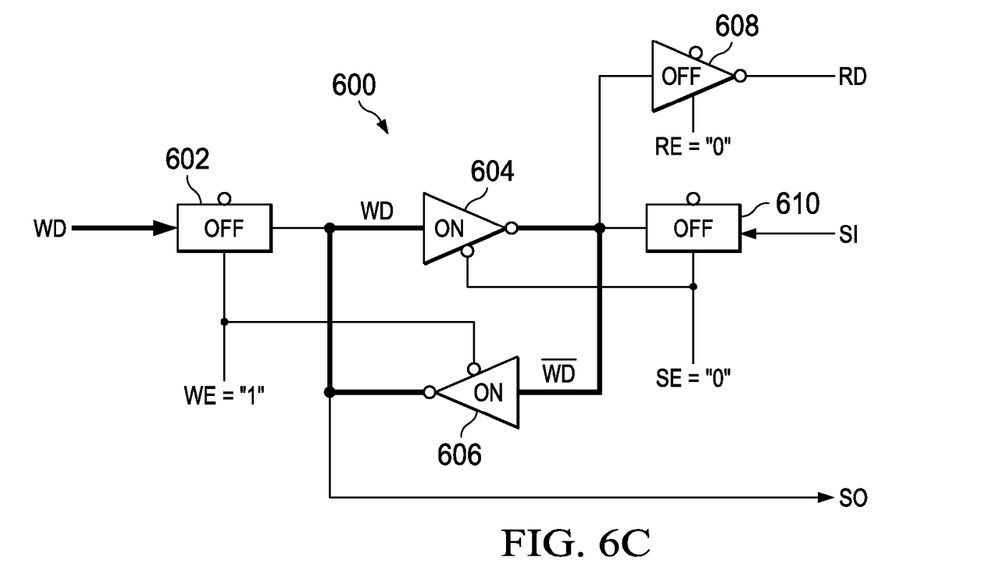
Figure 6D:
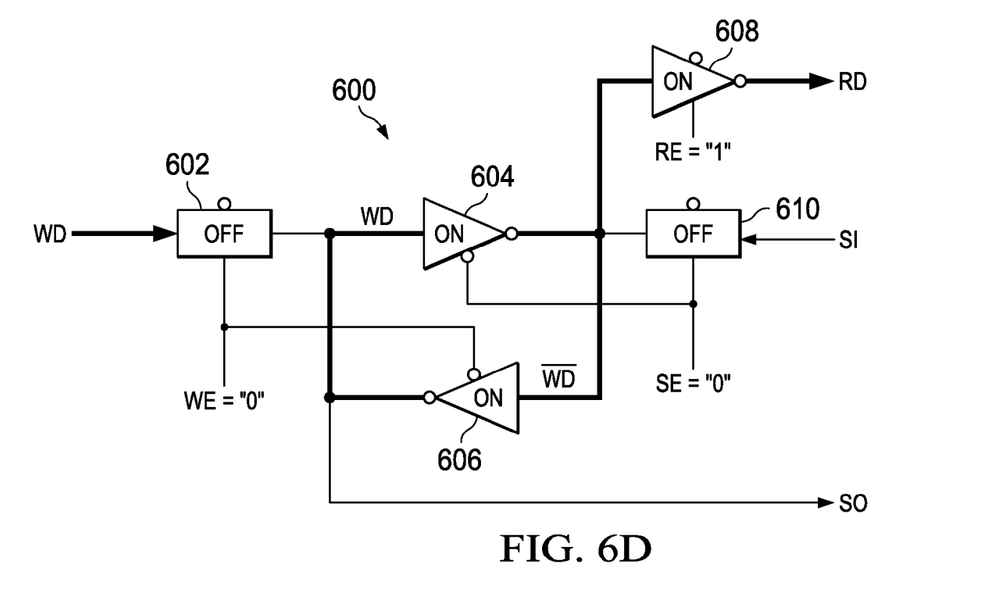

During a second scan mode, when the master control signal MASTER is "1", the latches 302-1 cannot be arranged to form a set of master-slave pairs without external latches. Preferably, for this scan mode, the even latch for each row ROW1 to ROWn forms a slave latch, and the odd latch for each row ROW1 to ROWn forms a master latch. Thus, to have a complete set of master-slave pairs, latches 310 and 316 at the beginning and end of the scan chain are employed and are enabled by muxes 312 and 318. Additionally, mux 332 is set by the master control signal MASTER to output scan clock signal SCK2, and mux 330 is set by the master control signal MASTER to output scan clock signal SCK1. The timing signals for the even latches (EVEN) and the odd latches (ODD) in this scan mode can be seen in FIG. 5B.

Figure 3B:
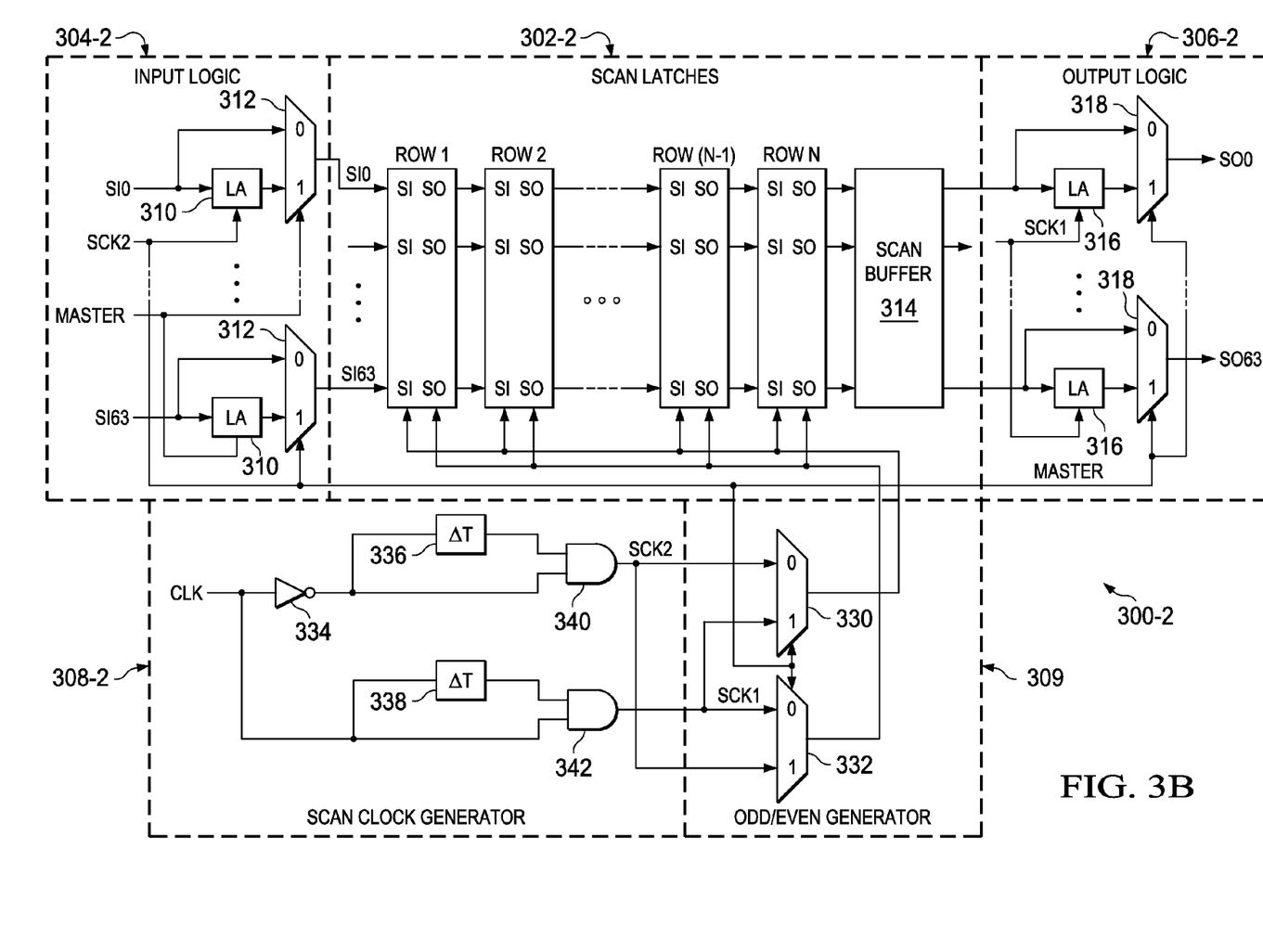

Turning to FIG. 3B, an alternative configuration with the same general operation can be seen. Some differences between architecture 300-1 and 300-2 are that multiple scan chains are employed and a different scan clock generator 308-2 is employed. Preferably, the latches 302-2 are arranged in a "test compress" configuration to form multiple scan chain (i.e., 64 scan chains as shown). This configuration employs (within the input logic 304-2) a latch 310 and mux 312 for each scan chain and employs (within the output logic 306-2) a latch 316 and mux 318.

Figure 4A:
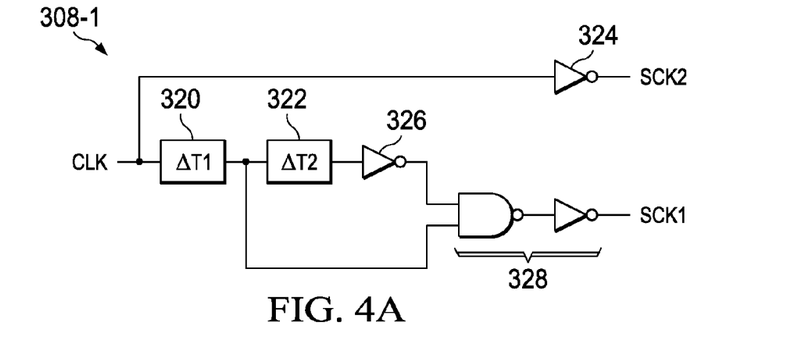
FIGS. 4A through 4D are circuit diagrams and timing diagrams depicting for the scan clock generators of FIG. 3A and/or FIG. 3B.
Figure 4B:
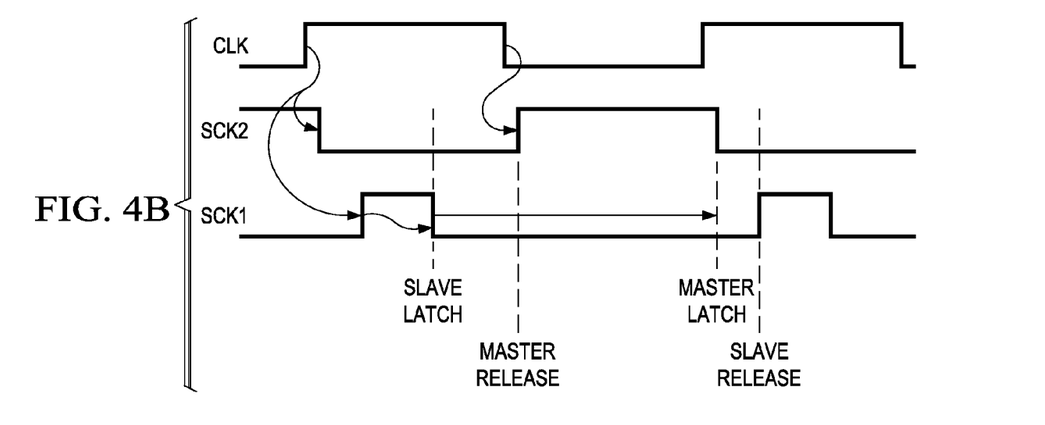

Referring now to FIGS. 4A and 4B, the operation and structure of scan clock generator 308-1 can be seen. As can be seen, the clock signal is inverted by inverter 324 to generate the scan clock signal SCK2. To generate the scan clock signal SCK1, the clock signal CLK, it is delayed by delay elements 320 (by a time $\Delta T1$), delay element 322 (by a time $\Delta T2$), and inverter 326. As the clock signal CLK transitions to logic high or "1", it is first delayed by $\Delta T1$ and provided to AND gate 328. Additionally, because the clock signal CLK was previously logic low or "0", inverter 326 provides a "1" to AND gate 328, which causes scan clock signal to transition to "1". Once the rising clock edge propagates through the delay element 322, inverter 326 provides a "0" to the AND gate 328, causing scan clock signal SCK1 to transition to "0". Thus, scan clock signal SCK1 and SCK2 are non-overlapping, allowing the mater latches and slave latches to latch on the rising edges of scan clock signals SCK2 and SCK2 (respectively) and allowing the mater latches and slave latches to release on the falling edges of scan clock signals SCK2 and SCK2 (respectively).

Figure 4C:
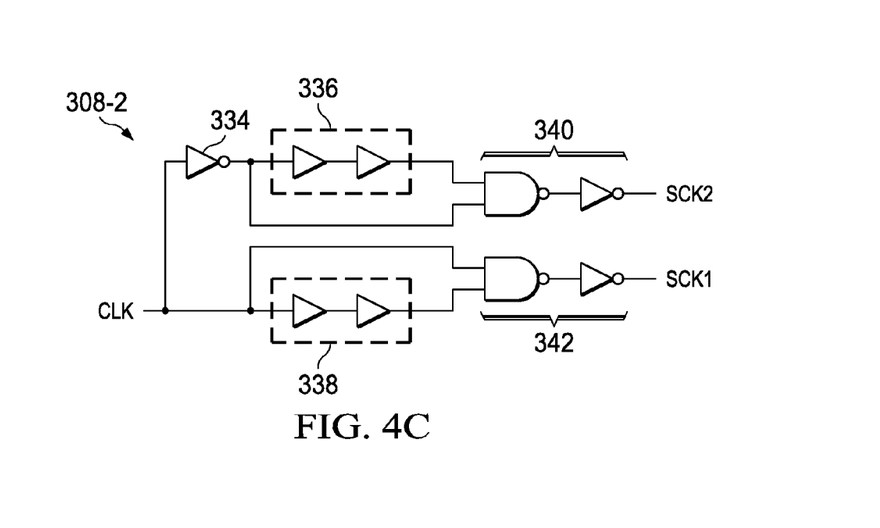
Figure 4D:
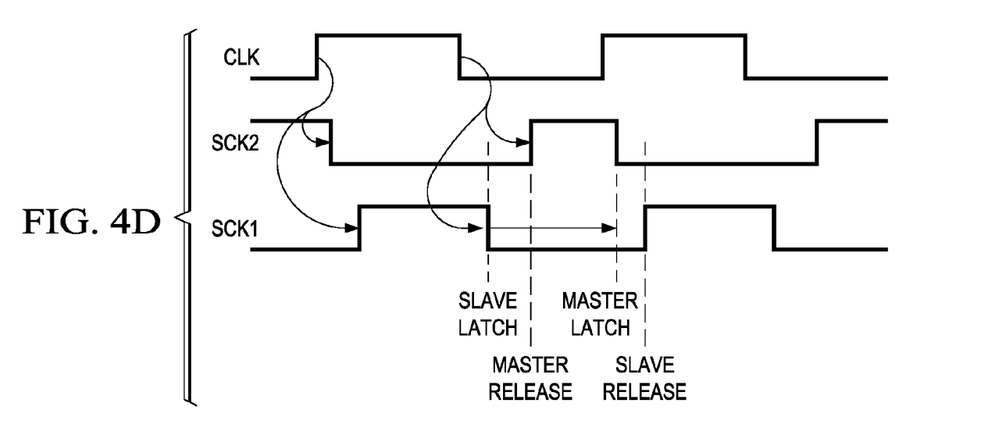

FIGS. 4C and 4D show the operation and structure of scan clock generator 308-2. The scan clock generator 308-2 has a similar operation to that of scan clock generator 308-1 in that non-overlapping scan clock signals SCK1 and SCK2 are provided, and either configuration can be employed. Initially, when the clock signal is "0", scan clock signal SCK1 is "0", and scan clock signal SCK2 is "1". When the clock signal CLK transitions to "1", inverter 334 causes the scan clock signal SCK2 to transition to transition to "0". Additionally, when the clock signal CLK transitions to "1", this "1" is provided to AND gate 342, and after the "1" propagates through delay element 338, the scan clock signal transitions SCK1 transitions to "1". When the clock signal transitions to "0", inverter 334 provides a "1" to AND gate 340, and after the "1" propagates through delay element 336, scan clock SCK2 transitions to "1". Additionally, when the clock signal transitions to "0", the "0" is provided to AND gate 342 to transition the scan clock signal to "0". Thus, scan clock generator 308-2, similar to scan clock generator 308-1, provides non-overlapping scan clock signals SCK1 and SCK2.

Turning to FIGS. 6A through 6D, a latch or scan latch 600, which generally comprise latches 302-1 and/or 302-2, is shown in greater detail. Latch 600 is generally comprised of transmission gates 602 and 610 and tristate inverters 604, 606, and 608. Initially, when write data WD is provided, the write enable signal becomes "1" to actuate the transmission gate 602. Additionally, tristate inverter 604 is actuated so as to the store the write data WD bit on the true and compliment side of the cell (which is generally comprised of inverters 604 and 606). Once the write data WD bit is written, the write enable signal becomes "0", disabling transmission gate 602 and enabling inverter 606. Then to read, the read enable RE is asserted to actuate the inverter 608. Additionally, the scan enable SE can be provided to transmission gate 610 to receive and store bits from scan input signal SI; a scan output signal SO can also be provided from the true or compliment side of the cell. Alternatively, the transmission gates 602 and 610 can be replaced with tristate inverters, and the tristate inverters 604, 606, and 608 can be replaced with transmission gates. Other functionally equivalent circuit may also be used in place of the transmission gates 602 and 610 and tristate inverters 604, 606, and 608.

Figure 7:
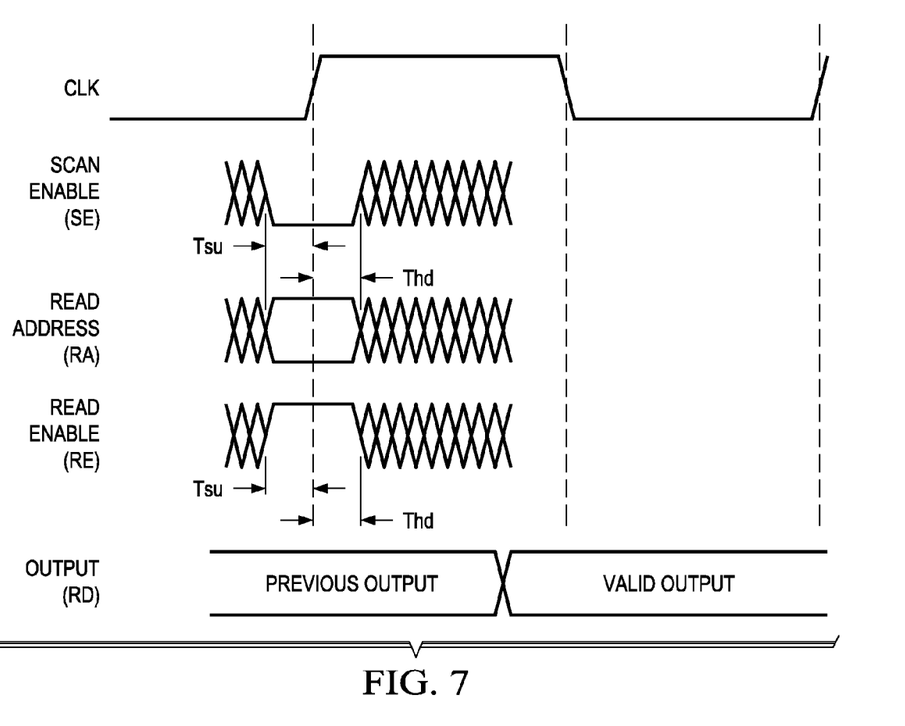
FIGS. 7 through 9 are timing diagrams depicting the operation of the scan latch of FIG. 6A.
Figure 8:
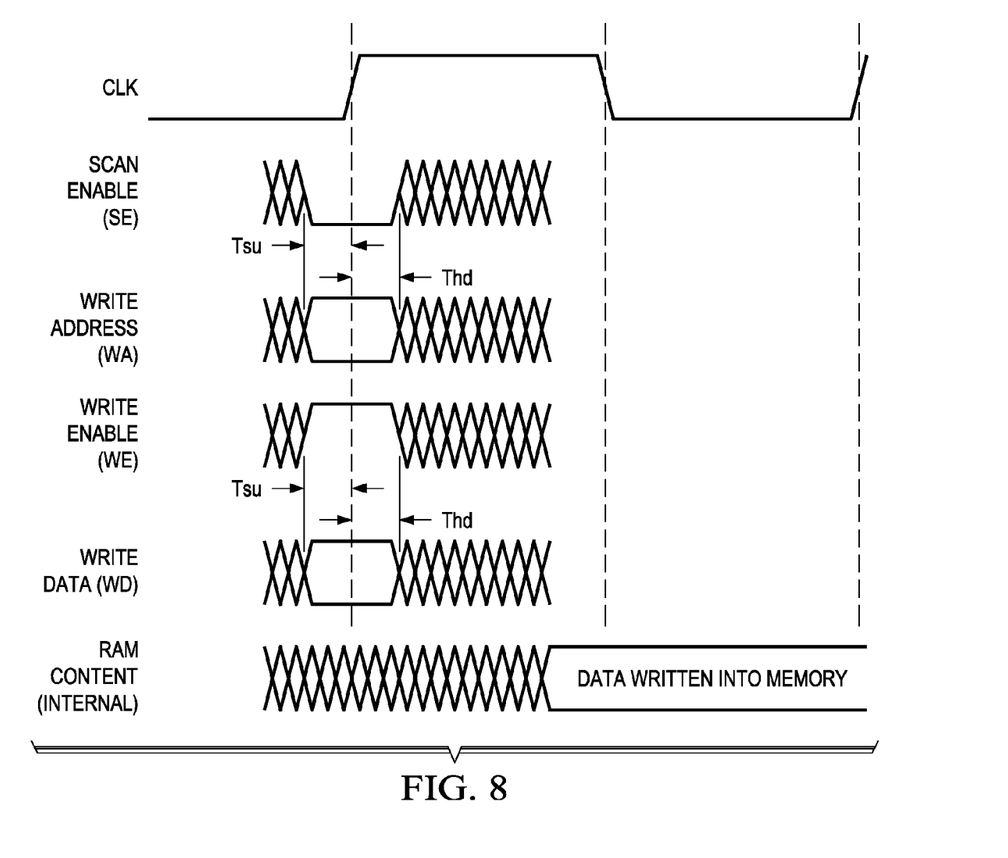
Figure 9:
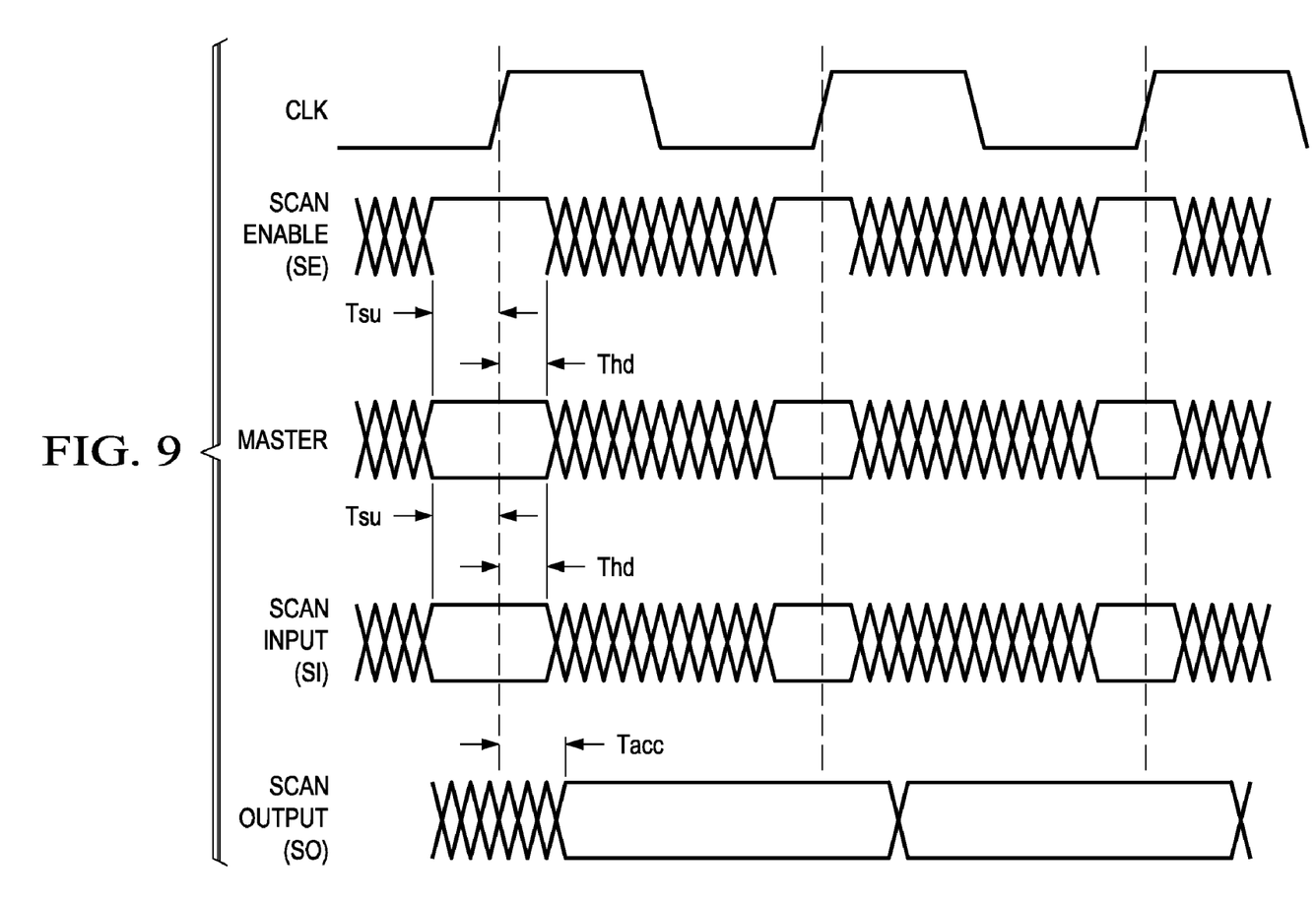

FIGS. 7-9 timing diagrams for SRFs 200-1 and 200-2 are shown. FIG. 7 shows the timing for a read cycle. FIG. 8 shows the timing for a write cycle, and FIG. 9 shows the timing for scan cycle.

By employing SRFs, such as SRFs 200-1 and 200-2, several advantages can be realized. Essentially, SRFs can fill the gap between flip-flop based and SRAM based implementations. In particular, SRFs can have fully static operations, operating at much lower voltages that SRAMs, and with less area overhead. SRFs also do not have the bulky BIST circuitry or the penalties associated therewith. Moreover, SRFs may only require the use of the first three metallization layers because of their configuration.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a scan chain having a plurality of scan latches that are coupled to one another, wherein each of the scan latches is controlled by one of a first latch control signal and a second latch control signal;
input logic including:
an input latch that is control by a first scan clock signal and that receives a scan input signal; and
a first multiplexer having a first input terminal, a second input terminal, a selection terminal, and an output terminal, wherein the first input terminal of the first multiplexer receives the scan input signal, and wherein the second terminal of the first multiplexer is coupled to the input latch, and wherein the selection terminal of the first multiplexer receives a master control signal, and wherein the output terminal of the first multiplexer is coupled to the scan chain;
output logic including:
an output latch that is control by a second scan clock signal and that is coupled to the scan chain; and
a second multiplexer having a first input terminal, a second input terminal, a selection terminal, and an output terminal, wherein the first input terminal of the second multiplexer is coupled to the scan chain, and wherein the second terminal of the second multiplexer is coupled to the output latch, and wherein the selection terminal of the second multiplexer receives the master control signal;
a scan clock generator that generates the first and second scan clock signals and that is coupled to the input and output latches; and
an odd/even generator that generates the first latch control signal and the second latch control signal, wherein the odd/even generator includes:
a third multiplexer having a first input terminal, a second input terminal, a selection terminal, and an output terminal, wherein each of the first and second input terminals of the third multiplexer is coupled to the scan clock generator, and wherein the selection terminal of the third multiplexer receives the master control signal, and wherein the output terminal of the third multiplexer is coupled to a first set of scan latches from the scan chain; and
a fourth multiplexer having a first input terminal, a second input terminal, a selection terminal, and an output terminal, wherein each of the first and second input terminals of the fourth multiplexer is coupled to the scan clock generator, and wherein the selection terminal of the fourth multiplexer receives the master control signal, and wherein the output terminal of the fourth multiplexer is coupled to a second set of scan latches from the scan chain.

2. The apparatus of claim 1, wherein the scan chain further comprises a plurality of scan chains.

3. The apparatus of claim 2, wherein the scan input signal further comprises a plurality of scan input signals, and wherein the input logic further comprises:
a plurality of input latches, wherein each input latch is associated with at least one of the scan input signals, and wherein each input latch is control by the first scan clock signal, and wherein each input latch that receives its associated scan input signal; and
a plurality of first multiplexers, wherein each first multiplexer has a first input terminal, a second input terminal, a selection terminal, and an output terminal, wherein each first multiplexer is associated with at least one of the input latches, and wherein the first input terminal of each first multiplexer receives its associated scan input signal, and wherein the second terminal of each first multiplexer is coupled to its associated input latch, and wherein the selection terminal of each first multiplexer receives the master control signal, and wherein the output terminal of each first multiplexer is coupled to at least one of the plurality of scan chains.

4. The apparatus of claim 2, wherein the output logic further comprises:
a plurality of output latches, wherein each output latch is control by a second scan clock signal, and wherein each output latch is associated with at least one of the plurality of the scan chains, and wherein each output latch is coupled to its associated scan chain; and
a plurality of second multiplexers, wherein each second multiplexer has a first input terminal, a second input terminal, a selection terminal, and an output terminal, wherein each second multiplexer is associated with at least one of the output latches, and wherein the first input terminal of each second multiplexer is coupled to its associated scan chain, and wherein the second terminal of each second multiplexer is coupled to its associated output latch, and wherein the selection terminal of each second multiplexer receives the master control signal.

5. The apparatus of claim 1, wherein the scan clock generator further comprises:
a first delay element that receives a clock signal;
a first inverter that is coupled receives the clock signal;
a second delay element that is coupled to the first delay element;
a second inverter that is coupled to the second delay element; and
a logic gate that is coupled to the first delay element and the second inverter.

6. The apparatus of claim 5, wherein the logic gate is an AND gate.

7. The apparatus of claim 1, wherein the scan clock generator further comprises:
a first inverter that receives a clock signal;
a first delay element that receives the clock signal;
a second delay element that is coupled to the first inverter;
a first logic gate that is coupled to first inverter and the second delay element; and
a second logic gate that is coupled to the first delay element and that receives the clocks signal.

8. The apparatus of claim 7, wherein each of the first and second logic gates further comprises an AND gate.

9. The apparatus of claim 1, wherein each scan latch further comprises:
a first transmission gate that is controlled by a write enable signal;
a first tristate inverter that is coupled to the first transmission gate and that is controlled by the write enable signal;
a second tristate inverter that is coupled to first transmission gate and that is controlled by at least one of the first and second latch control signals;
a third tristate inverter that is coupled to the first and second tristate inverters, wherein the third tristate inverter is controlled by a read enable signal; and
a third transmission gate that is coupled to the first and second tristate inverters, wherein the third transmission gate is controlled by at least one of the first and second latch control signals.

10. An apparatus comprising:
a memory array having a plurality of memory cells;
a scan chain having a plurality of scan latches that are coupled to one another, wherein each of the scan latches is controlled by one of a first latch control signal and a second latch control signal, and wherein the scan chain is coupled to the memory array;
input logic including:
an input latch that is control by a first scan clock signal and that receives a scan input signal; and
a first multiplexer having a first input terminal, a second input terminal, a selection terminal, and an output terminal, wherein the first input terminal of the first multiplexer receives the scan input signal, and wherein the second terminal of the first multiplexer is coupled to the input latch, and wherein the selection terminal of the first multiplexer receives a master control signal, and wherein the output terminal of the first multiplexer is coupled to the scan chain;
output logic including:
an output latch that is control by a second scan clock signal and that is coupled to the scan chain; and
a second multiplexer having a first input terminal, a second input terminal, a selection terminal, and an output terminal, wherein the first input terminal of the second multiplexer is coupled to the scan chain, and wherein the second terminal of the second multiplexer is coupled to the output latch, and wherein the selection terminal of the second multiplexer receives the master control signal;
a scan clock generator that generates the first and second scan clock signals and that is coupled to the input and output latches; and
an odd/even generator that generates the first latch control signal and the second latch control signal, wherein the odd/even generator includes:
a third multiplexer having a first input terminal, a second input terminal, a selection terminal, and an output terminal, wherein each of the first and second input terminals of the third multiplexer is coupled to the scan clock generator, and wherein the selection terminal of the third multiplexer receives the master control signal, and wherein the output terminal of the third multiplexer is coupled to a first set of scan latches from the scan chain; and
a fourth multiplexer having a first input terminal, a second input terminal, a selection terminal, and an output terminal, wherein each of the first and second input terminals of the fourth multiplexer is coupled to the scan clock generator, and wherein the selection terminal of the fourth multiplexer receives the master control signal, and wherein the output terminal of the fourth multiplexer is coupled to a second set of scan latches from the scan chain;
a controller that is coupled to the scan chain, the input logic, the output logic, and the odd/even generator;
a read decoder that is coupled to the memory array; and
a write decoder that is coupled to the memory array.

11. The apparatus of claim 10, wherein the scan chain further comprises a plurality of scan chains that are each coupled to the memory array.

12. The apparatus of claim 11, wherein the scan input signal further comprises a plurality of scan input signals, and wherein the input logic further comprises:
a plurality of input latches, wherein each input latch is associated with at least one of the scan input signals, and wherein each input latch is control by the first scan clock signal, and wherein each input latch that receives its associated scan input signal; and
a plurality of first multiplexers, wherein each first multiplexer has a first input terminal, a second input terminal, a selection terminal, and an output terminal, wherein each first multiplexer is associated with at least one of the input latches, and wherein the first input terminal of each first multiplexer receives its associated scan input signal, and wherein the second terminal of each first multiplexer is coupled to its associated input latch, and wherein the selection terminal of each first multiplexer receives the master control signal, and wherein the output terminal of each first multiplexer is coupled to at least one of the plurality of scan chains.

13. The apparatus of claim 11, wherein the output logic further comprises:
a plurality of output latches, wherein each output latch is control by a second scan clock signal, and wherein each output latch is associated with at least one of the plurality of the scan chains, and wherein each output latch is coupled to its associated scan chain; and a plurality of second multiplexers, wherein each second multiplexer has a first input terminal, a second input terminal, a selection terminal, and an output terminal, wherein each second multiplexer is associated with at least one of the output latches, and wherein the first input terminal of each second multiplexer is coupled to its associated scan chain, and wherein the second terminal of each second multiplexer is coupled to its associated output latch, and wherein the selection terminal of each second multiplexer receives the master control signal.

14. The apparatus of claim 10, wherein the scan clock generator further comprises:
a first delay element that receives a clock signal;
a first inverter that is coupled receives the clock signal;
a second delay element that is coupled to the first delay element;
a second inverter that is coupled to the second delay element; and
a logic gate that is coupled to the first delay element and the second inverter.

15. The apparatus of claim 14, wherein the logic gate is an AND gate.

16. The apparatus of claim 10, wherein the scan clock generator further comprises:
a first inverter that receives a clock signal;
a first delay element that receives the clock signal;
a second delay element that is coupled to the first inverter;
a first logic gate that is coupled to first inverter and the second delay element; and
a second logic gate that is coupled to the first delay element and that receives the clocks signal.

17. The apparatus of claim 16, wherein each of the first and second logic gates further comprises an AND gate.

18. The apparatus of claim 10, wherein each scan latch further comprises:
a first transmission gate that is controlled by a write enable signal;
a first tristate inverter that is coupled to the first transmission gate and that is controlled by the write enable signal;
a second tristate inverter that is coupled to first transmission gate and that is controlled by at least one of the first and second latch control signals;
a third tristate inverter that is coupled to the first and second tristate inverters, wherein the third tristate inverter is controlled by a read enable signal; and
a third transmission gate that is coupled to the first and second tristate inverters, wherein the third transmission gate is controlled by at least one of the first and second latch control signals.

\* \* \* \* \*